US006737311B2

(12) United States Patent
Desko et al.

(10) Patent No.: US 6,737,311 B2
(45) Date of Patent: May 18, 2004

(54) SEMICONDUCTOR DEVICE HAVING A BURIED LAYER FOR REDUCING LATCHUP AND A METHOD OF MANUFACTURE THEREFOR

(75) Inventors: John Desko, Wescosville, PA (US); Chung-Ming Hsieh, Wyomissing, PA (US); Bailey Jones, Mohnton, PA (US); Thomas J. Krutsick, Fleetwood, PA (US); Brian Thompson, Sinking Spring, PA (US); Steve Wallace, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/964,041

(22) Filed: Sep. 26, 2001

(65) Prior Publication Data

US 2003/0057494 A1 Mar. 27, 2003

(51) Int. Cl.[7] .............................................. H01L 29/72
(52) U.S. Cl. ...................... 438/217; 438/151; 438/163; 438/197; 438/232; 257/349; 257/350; 257/352; 257/356; 257/357

(58) Field of Search .................................. 257/349, 350, 257/352, 356, 357; 438/151, 163, 197, 217, 232

(56) References Cited

U.S. PATENT DOCUMENTS

| 4,105,475 A | * | 8/1978 | Jenne ......................... 257/349 |
| 5,374,843 A | * | 12/1994 | Williams et al. ............ 257/492 |
| 5,428,233 A | * | 6/1995 | Walczyk ..................... 257/349 |
| 5,578,856 A | * | 11/1996 | Subrahmanyan et al. ... 257/349 |
| 6,404,009 B1 | * | 6/2002 | Mori ........................... 257/335 |

\* cited by examiner

Primary Examiner—Edward Wojciechowicz

(57) ABSTRACT

The present invention provides a semiconductor device, a method of manufacture therefor, and an integrated circuit including the semiconductor device. The semiconductor device may include a well doped with a P-type dopant located over a semiconductor substrate. The semiconductor device may further include a buried layer including the P-type dopant located between the well and the semiconductor substrate, and a gate located over the well.

17 Claims, 9 Drawing Sheets

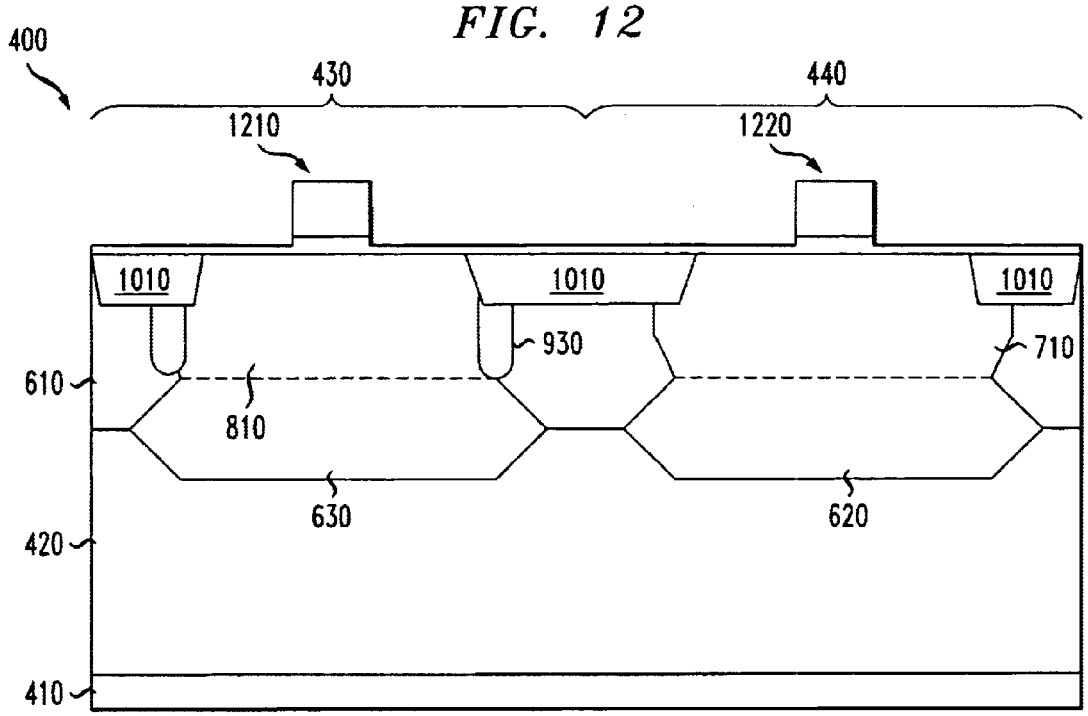
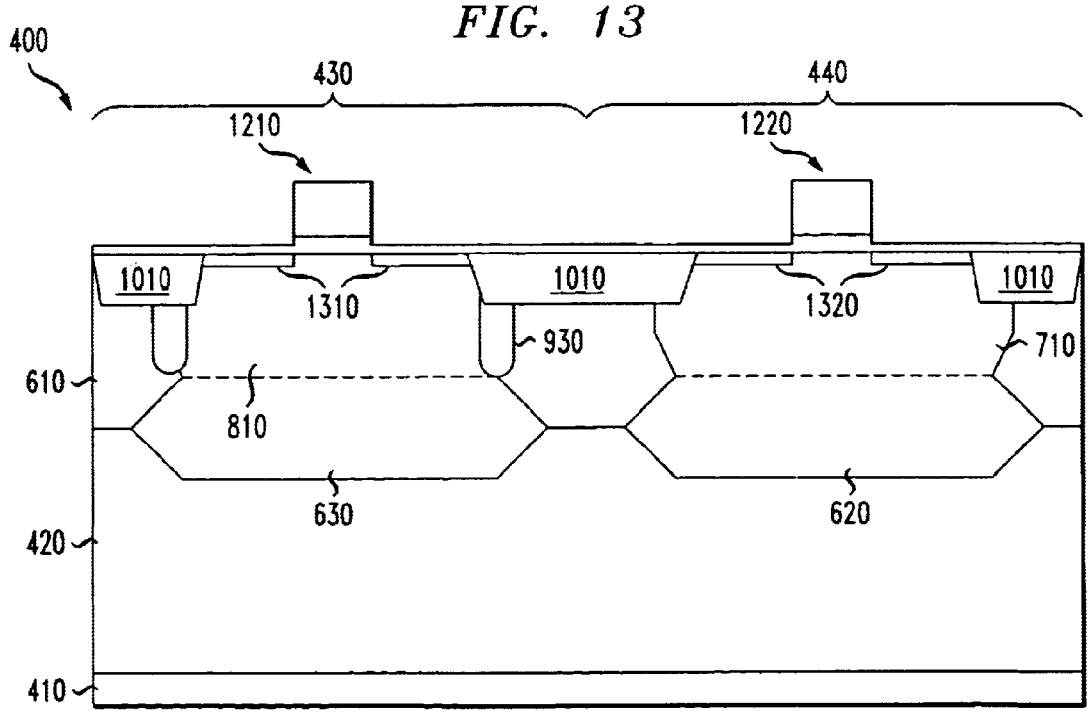

SEMICONDUCTOR DEVICE HAVING A BURIED LAYER FOR REDUCING LATCHUP AND A METHOD OF MANUFACTURE THEREFOR

TECHNICAL FIELD OF THE INVENTION

The present invention is directed, in general, to an integrated circuit and, more specifically, to a semiconductor device having a buried layer for reducing latchup, and a method of manufacture therefor.

BACKGROUND OF THE INVENTION

Integrated circuits are well known and are extensively used in various present day technological devices and systems, such as sophisticated telecommunications and computer systems of all types. As the use of integrated circuits continues to grow, the demand for more inexpensive and improved integrated circuits also continues to rise. Thus, presently, an emphasis in the integrated circuit industry is to provide higher density, faster devices at a competitive price.

Complementary metal oxide semiconductor (CMOS) devices are some of the above-mentioned devices wherein there is currently an emphasis placed upon increasing both speed and density. Increasing the density of CMOS devices, however, tends to create undesirable parasitic bipolar transistors, which can latch-up the CMOS devices, drawing high current.

Bipolar parasitic transistors are generally formed when doped regions of two metal-oxide semiconductor (MOS) transistors are positioned very close together. A parasitic pnp bipolar transistor may be formed when a source/drain region of a P-channel MOS (PMOS) device acts as an emitter, a well of an adjacent N-channel MOS (NMOS) device acts as a base, and a P-type doped substrate acts as the collector. Alternatively, a parasitic npn bipolar transistor may be formed when a source/drain region of the NMOS device acts as an emitter, a substrate tie of the NMOS device acts as a base, and the well of the NMOS device acts as the collector.

Turning to Prior Art FIG. 1, illustrated are resistances $Rs_1$, $Rs_2$, $Rw_1$, $Rw_2$ that may arise in conventional CMOS devices 100, in conjunction with the bipolar parasitic transistors. The resistances, in particular resistances $Rs_1$ and $Rw_1$ that form across emitter base junctions, tend to cause latch-up by turning on the parasitic bipolar transistors.

Turning to Prior Art FIG. 2, with continued reference to FIG. 1, depicted is a circuit 200, which more clearly illustrates the resistances $Rs_1$, $Rs_2$, $Rw_1$, $Rw_2$. If enough current is being drawn through the resistances $Rs_1$, $Rs_2$, $Rw_1$, $Rw_2$ to force the parasitic bipolar transistor on, and a gain of a resistance loop 210 is greater than 1, the CMOS devices 100 tend to latch-up and begins to pull a large amount of current. This is an undesirable effect that may load down the power supply, stop circuit functionality, or destroy the CMOS devices 100.

Accordingly, what is needed in the art is a CMOS device and a method of manufacture therefor that does not experience the problems experienced by the prior art CMOS devices. A CMOS device that does not experience the latch-up problems associated with the parasitic bipolar transistors, is particularly desirable.

SUMMARY OF THE INVENTION

To address the above-discussed deficiencies of the prior art, the present invention provides a semiconductor device, a method of manufacture therefor, and an integrated circuit including the semiconductor device. The semiconductor device may include a well doped with a P-type dopant located over a semiconductor substrate. The semiconductor device may further include a buried layer including the P-type dopant located between the well and the semiconductor substrate, and a gate located over the well.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which:

Prior Art

FIG. 12 illustrates a cross-sectional view of the partially completed semiconductor device illustrated in FIG. 11 after defining an NMOS gate and a PMOS gate;

FIG. 13 illustrates a cross-sectional view of the partially completed semiconductor device shown in FIG. 12, after formation of lightly doped NMOS source/drain regions and lightly doped PMOS source/drain regions;

DETAILED DESCRIPTION

Figure 3:
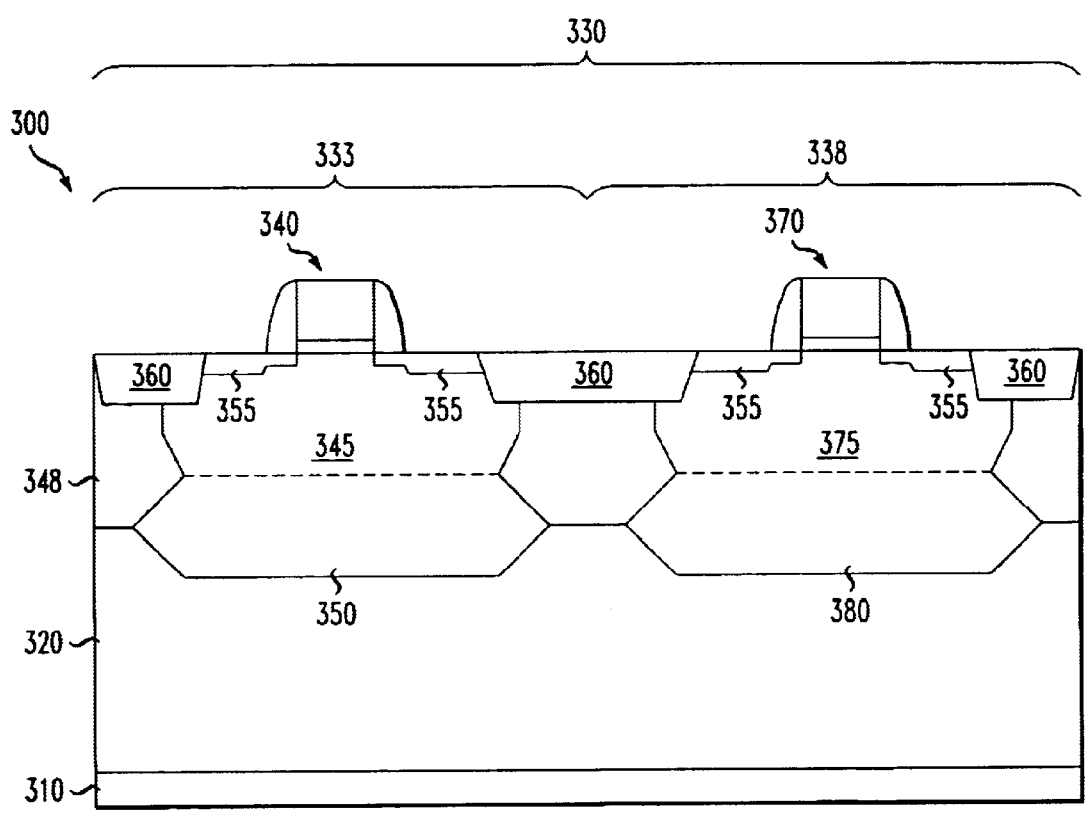
FIG. 3 illustrates a cross-sectional view of a completed semiconductor device, which has been manufactured in accordance with the principles of the present invention.

Referring initially to FIG. 3, illustrated is a cross-sectional view of a completed semiconductor device 300, which has been manufactured in accordance with the principles of the present invention. In the illustrative embodiment shown in FIG. 3, the semiconductor device 300 may include a semiconductor substrate 310 having a lightly doped substrate layer 320 located there over. Formed over the semiconductor substrate 310 and the lightly doped substrate layer 320 are complementary metal oxide semiconductor (CMOS) devices 330. In the illustrative embodiment shown in FIG. 3, the CMOS devices 330 includes an N-channel metal oxide semiconductor (NMOS) device and a P-channel metal oxide semiconductor (PMOS)device, 333, 338, respectively. While only the NMOS device 333 and PMOS device 338 have been shown, it should be understood that other devices are within the scope of the present invention.

In the embodiment shown in FIG. 3, the PMOS device 338 includes a first gate 370 formed over a first well 375. The PMOS device 338 also includes a first buried layer 380 located between the first well 375 and the semiconductor substrate 310. As illustrated, the first well 375 may be located within the epitaxial layer 348. In an exemplary embodiment, the first buried layer 380 and the first well 375 both comprise a first dopant, e.g., an N-type dopant. The PMOS device may further include source/drain regions 355 and isolation structures 360.

Figure 1:
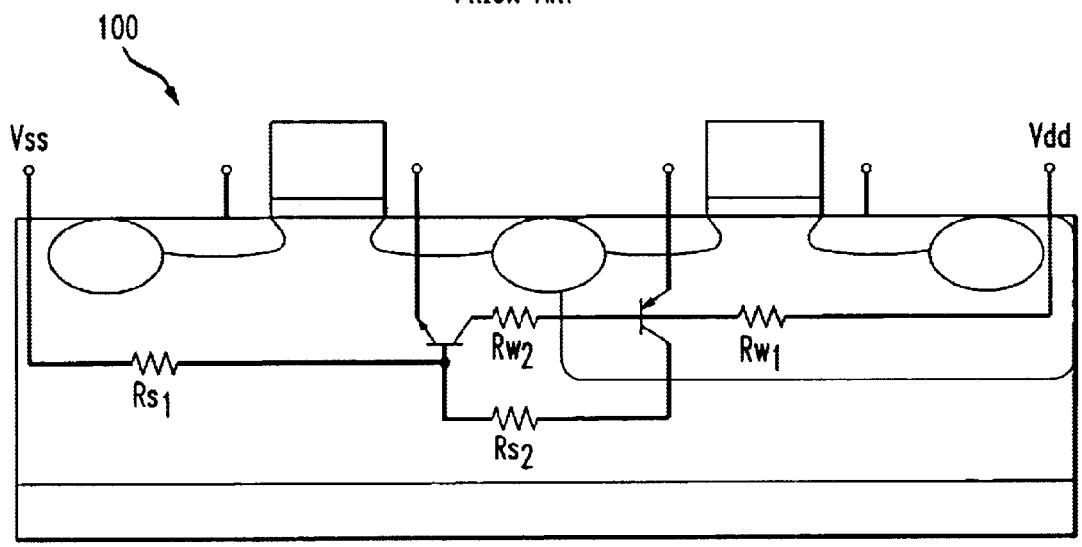
FIG. 1 illustrates resistances $Rs_1$, $Rs_2$, $Rw_1$, $Rw_2$ that may arise in a conventional CMOS device, as a result of bipolar parasitic transistors.
Figure 2:
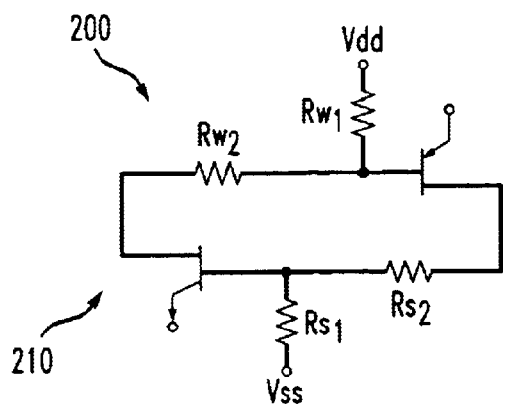
FIG. 2 illustrates a circuit, which more clearly illustrates the resistances Rs1, Rs2, Rw1, Rw2 depicted in FIG. 1.

In the embodiment shown in FIG. 3, the NMOS device 333 includes a second gate 340 formed over a second well 345. Similar to above, the second well 345 may be located within an epitaxial layer 348. The NMOS device 333 further includes a second buried layer 350 located between the second well 345 and the semiconductor substrate 310. In an exemplary embodiment, the second buried layer 350 and the second well 345 comprise a second dopant, e.g., a P-type dopant. The NMOS device 333 may further include the source/drain regions 355 and the isolation structures 360. While the present invention has currently been described using the structure illustrated in FIG. 1, it should be noted that other embodiments of the semiconductor device 300 are within the scope of the present invention. For example, in an alternative embodiment, an additional lightly doped N-well may be formed under both the NMOS device 333 and PMOS device 338. In such an example, the NMOS device 333 is isolated in its own lightly doped N-well.

Because the NMOS device 333 and the PMOS device 338 have buried layers 350, 380, located thereunder, the semiconductor device 300 does not experience many of the problems experienced by the prior art semiconductor devices. In one example, the buried layers 350, 380 help substantially reduce a gain of the bipolar parasitic transistors associated with the semiconductor device 300, as compared to that which might be associated with the prior art semiconductor devices. In another example, the buried layers 350, 380 help substantially reduce any resistances that may arise across emitter base junctions associated with the bipolar parasitic transistors. Because the resistances are substantially reduced, the parasitics require more current to forward bias the emitter-base junctions of the bipolar transistors. As such, the semiconductor device 300 experiences a smaller amount of latchup than the prior art devices.

Certain embodiments of the semiconductor device 300 benefit by forming the buried layers 350, 380 prior to forming the epitaxial layer 348. Because the buried layers 350, 380 may be formed prior to forming the epitaxial layer 348, as compared to diffusing the buried layers 350, 380 through the epitaxial layer 348 as provided in another embodiment, there is a reduced threat of any dopant associated with the buried layers 350, 380 being located within the source/drain regions 355. Because there is a reduced threat of any dopant associated with the buried layers 350, 380 being located within the source/drain regions 3551 a thinner epitaxial layer 348 may be used. For example, an epitaxial layer 348 thickness of less than about 5000 nm may be used if the buried layers 350, 380 are formed prior to the epitaxial layer 348, as compared to a required epitaxial thickness of greater than about 5000 nm if the buried layers 350, 380 are diffused through the epitaxial layer 348. Reducing the thickness of the epitaxial layer 348 allows the manufacturer to further reduce latch-up issues. While it has been shown that the buried layers 350, 380 are located within the lightly doped substrate layer 320, it should be understood that they may be formed directly within the semiconductor substrate 310 without departing from the scope of the present invention. In an alternative embodiment, the buried layers 350, 380 are implanted a large enough distance into the semiconductor substrate 310 that the first and second wells 375, 345, respectively, may be formed above the buried layers 350, 380 and also within the semiconductor substrate 310. In such a case, the epitaxial layer 348 is not needed.

Figure 4:
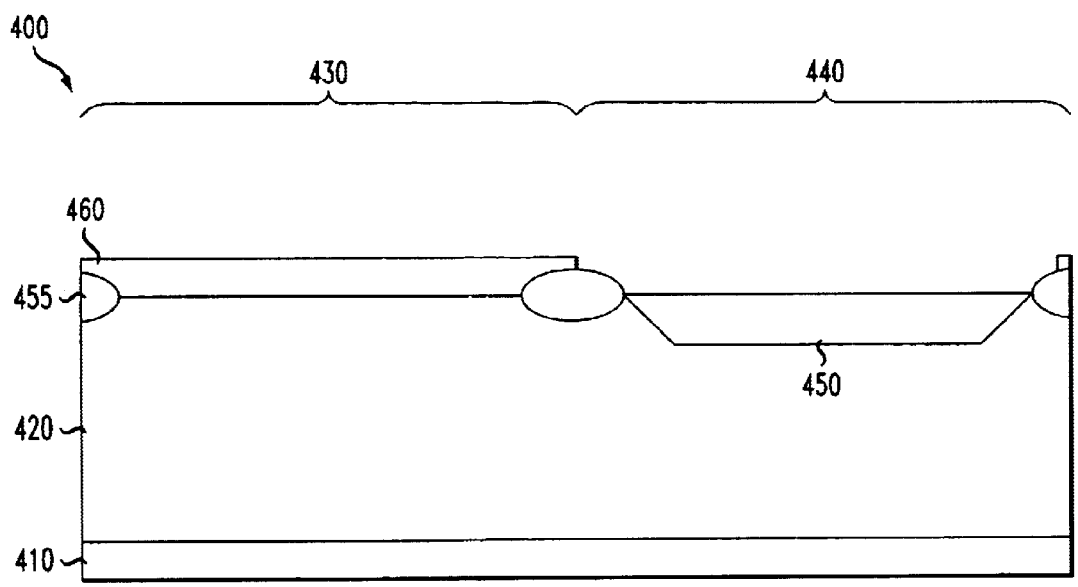
FIG. 4 illustrates a cross-sectional view of a partially completed semiconductor device having a first buried layer in a PMOS device region.

Turning to FIGS. 4–15, illustrated are cross-sectional views of detailed manufacturing steps instructing how one might, in an advantageous embodiment, manufacture a semiconductor device similar to the semiconductor device 300 depicted in FIG. 3. FIG. 4 illustrates a cross-sectional view of a partially completed semiconductor device 400. The partially completed semiconductor device 400 includes a semiconductor substrate 410. The semiconductor substrate 410 may comprise many materials, dopants and dopant concentrations, however, in an exemplary embodiment the semiconductor substrate 410 comprises a P+ doped silica substrate having a dopant concentration ranging from about 5E18 atoms/cm$^3$ to about 5E19 atoms/cm$^3$.

Located over the semiconductor substrate 410, in the embodiment shown in FIG. 4, is a lightly doped substrate layer 420. The lightly doped substrate layer 420 may comprise many materials, however, in an exemplary embodiment the lightly doped substrate layer 420 comprises doped silica having a final thickness ranging from about 4000 nm to about 8000 nm. The lightly doped substrate layer 420 generally has a similar dopant type as the semiconductor substrate 410, however, at a lower dopant concentration. For example, if the semiconductor substrate 410 has a P-type dopant concentration of about 1E19 atoms/cm$^3$, the lightly doped substrate layer 420 might have a P-type dopant concentration ranging from about 1E14 atoms/cm$^3$ to about 5E14 atoms/cm$^3$.

The embodiment of the partially completed semiconductor device 400 illustrated in FIG. 4, includes two device regions. The two device regions illustrated in FIG. 4 include an NMOS device region 430 and a PMOS device region 440. While only a single NMOS device region 430 and single PMOS device region 440 are shown in FIG. 4, and for that matter the remainder of the FIGURES, it should be noted that various other active or passive devices, such as npn and pnp bipolar transistors, could be located adjacent the NMOS device region 430 and PMOS device region 440. In an exemplary embodiment, the NMOS device region 430 and the PMOS device region 440 are formed in a similar process flow as used to form the previously mentioned npn and pnp bipolar transistors.

Formed within the PMOS device region 440 of the lightly doped substrate layer 420, is a first buried layer 450. In the current example, a conventional PBL oxide 455 and a photoresist mask 460 are used to define the first buried layer 450. It should be noted, however, that other techniques known to those skilled in the art may also be used to form the first buried layer 450.

The first buried layer 450, which desirably includes an N-type dopant (e.g., Arsenic), may have an initial thickness (e.g., as implanted) ranging from about 700 nm to about 900 nm. The first buried layer 450 may have various dopant concentrations, however, dopant concentrations ranging from about 1E18 atoms/cm$^3$ to about 5E19 atoms/cm$^3$, and more specifically a dopant concentration of about 1E19 atoms/cm$^3$, have been found to be particularly useful. The first buried layer 450 may be formed using an energy of about 110 keV.

Figure 5:
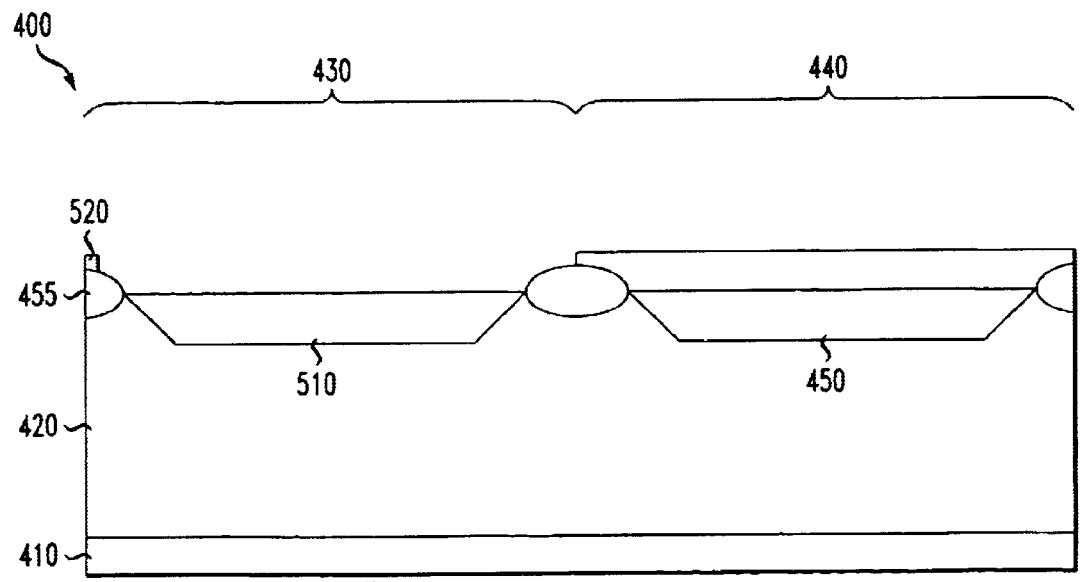
FIG. 5 illustrates a cross-sectional view of the partially completed semiconductor device illustrated in FIG. 4, after formation of a second buried layer in an NMOS device region.

Turning now to FIG. 5, shown is a cross-sectional view of the partially completed semiconductor device 400 illustrated in FIG. 4, after formation of a second buried layer 510. As illustrated, the second buried layer 510 may be located within the NMOS device region 430 of the lightly doped substrate layer 420. A conventional photoresist mask 520 may be used to define the second buried layer 510.

The second buried layer 510, which desirably includes a P-type dopant (e.g., Boron), may have an initial thickness similar to the thickness of the first buried layer 450. The second buried layer 510 may also have various dopant concentrations, however, dopant concentrations ranging from about 1E18 atoms/cm$^3$ to about 5E19 atoms/cm$^3$, and more specifically a dopant concentration of about 1E19 atoms/cm$^3$, have been found to be particularly useful. The second buried layer 510 may be formed using various techniques. For example, in an exemplary embodiment the second buried layer 510 may be formed using a high energy implant. In one particular example, an energy of about 200 keV may be used.

Figure 6:
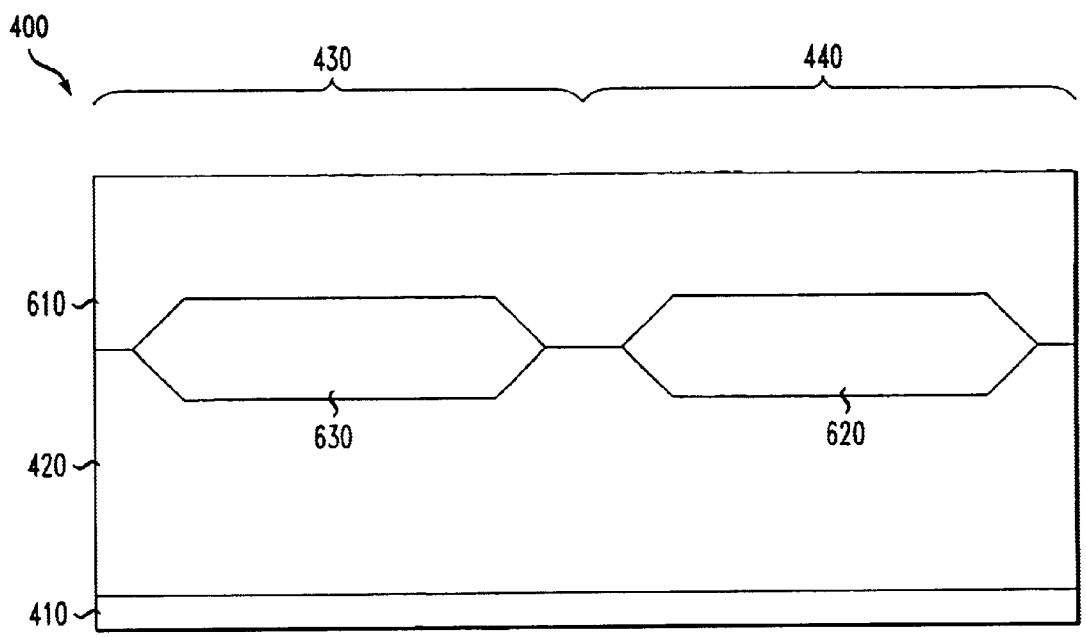
FIG. 6 illustrates a cross-sectional view of the partially completed semiconductor device shown in FIG. 5, after formation of an epitaxial layer over the semiconductor substrate.

Turning now to FIG. 6, illustrated is a cross-sectional view of the partially completed semiconductor device 400 shown in FIG. 5, after formation of an epitaxial layer 610 over the first and second buried layers 450, 510. The epitaxial layer 610 may be formed using various conventional techniques. Additionally, the epitaxial layer 610 may have a wide range of thicknesses. Preferably, the epitaxial layer 610 has a thickness of less than about 5000 nm. In an exemplary embodiment, however, the epitaxial layer 610 has a thickness ranging from about 1000 nm to about 2000 nm, and more preferably a thickness of about 1200 nm. Likewise, the epitaxial layer 610 may be a doped epitaxial layer. In such an embodiment, the epitaxial layer 610 may include an N-type dopant, such as arsenic, at a concentration of about 6E15 atoms/cm$^3$. While specifics have been given regarding the epitaxial layer 610, one skilled in the art understands that various other conditions are within the scope of the present invention.

Notice that in certain embodiments, increased temperatures may cause the first and second buried layers 450, 510 of FIG. 5 to up diffuse into a portion of the epitaxial layer 610, resulting in completed first and second buried layers 620, 630, respectively. Such an up diffusion should be taken into account when determining how thick the epitaxial layer 610 should be formed. After any resulting up diffusion, the completed first and second buried layers 620, 630 should have a thickness ranging from about 1000 nm to about 3000 nm.

Figure 7:
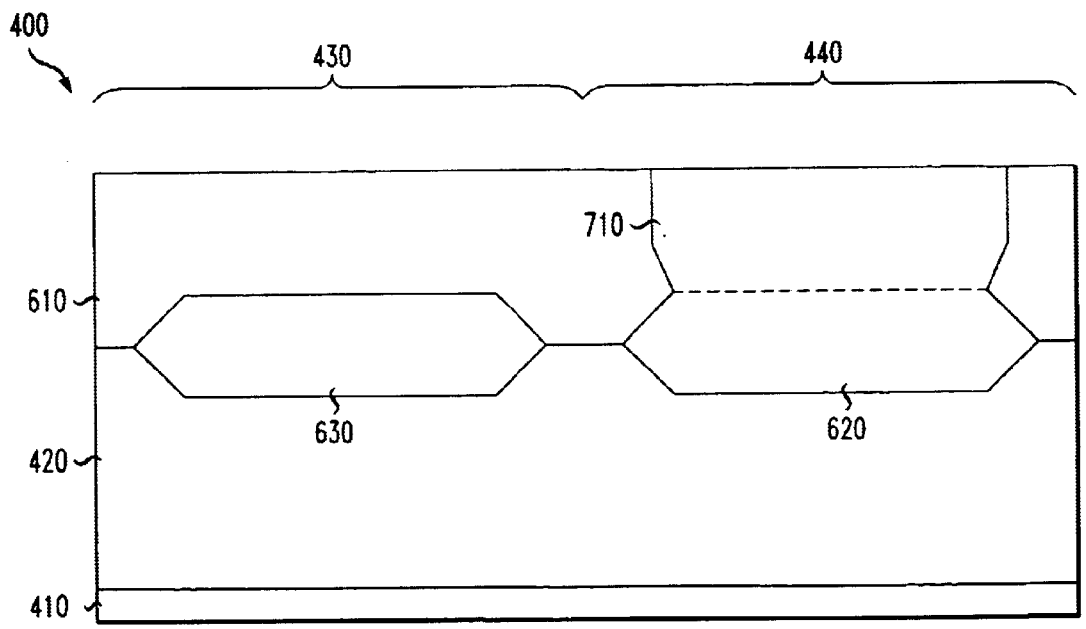
FIG. 7 illustrates a cross-sectional view of the partially completed semiconductor device illustrated in FIG. 6, after formation of a first well within the PMOS device region of the epitaxial layer.

Turning now to FIG. 7, shown is a cross-sectional view of the partially completed semiconductor device 400 illustrated in FIG. 6, after formation of a first well 710 within the PMOS device region 440 of the epitaxial layer 610. Because the first well 710 is located within the PMOS device region 440, the first well 710 will generally be an N-well, doped with an N-type dopant. In an exemplary embodiment, the first well 710 has an N-type dopant concentration ranging from about 8E15 atoms/cm$^3$ to about 5E16 atoms/cm$^3$, with a preferred value being about 2E16 atoms/cm$^3$. Other first well 710 dopant types and concentrations are, however, within the scope of the present invention. The first well 710 may be formed using a conventional photoresist mask and implantation process.

Figure 8:
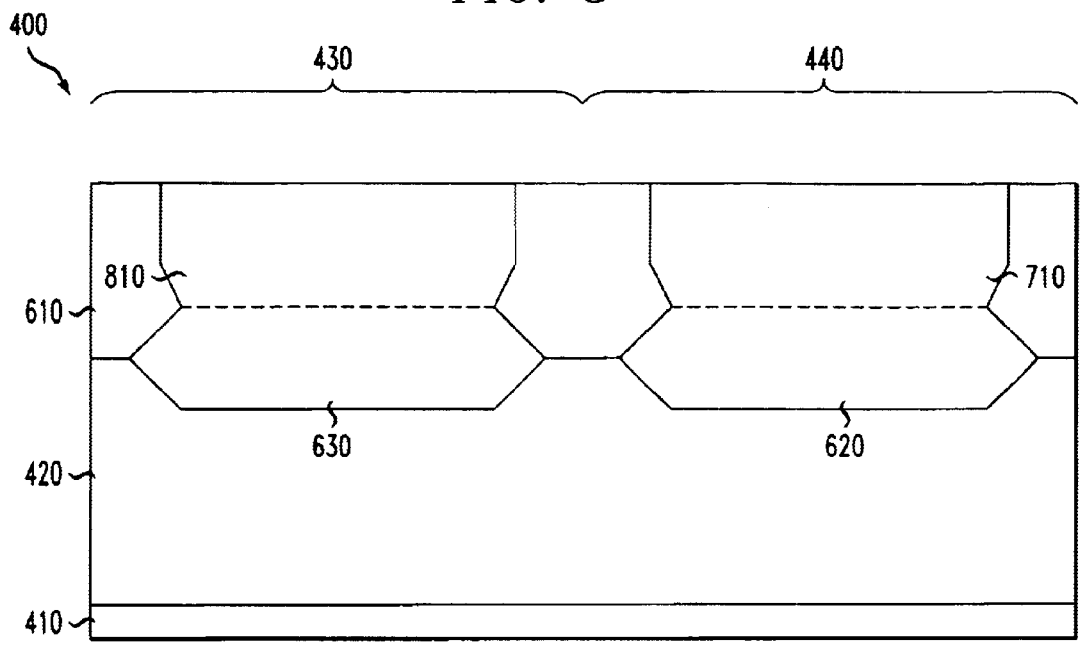
FIG. 8 illustrates a cross-sectional view of the partially completed semiconductor device illustrated in FIG. 7, after formation of a second well within the NMOS device region 440 of the epitaxial layer.

Turning now to FIG. 8, shown is a cross-sectional view of the partially completed semiconductor device 400 illustrated in FIG. 7, after formation of a second well 810 within the NMOS device region 430 of the epitaxial layer 610. Because the second well 810 is located within the NMOS device region 430, the second well 810 will generally be a P-well, doped with a P-type dopant. In an exemplary embodiment, the second well 810 has a P-type dopant concentration ranging from about 8E15 atoms/cm$^3$ to about 5E16 atoms/cm$^3$, with a preferred value being about 2E16 atoms/cm$^3$. Other second well 810 dopant types and concentrations are, however, within the scope of the present invention. Similar to the first well 710, the second well 810 may be formed using a conventional photoresist mask and implantation process.

Figure 9:
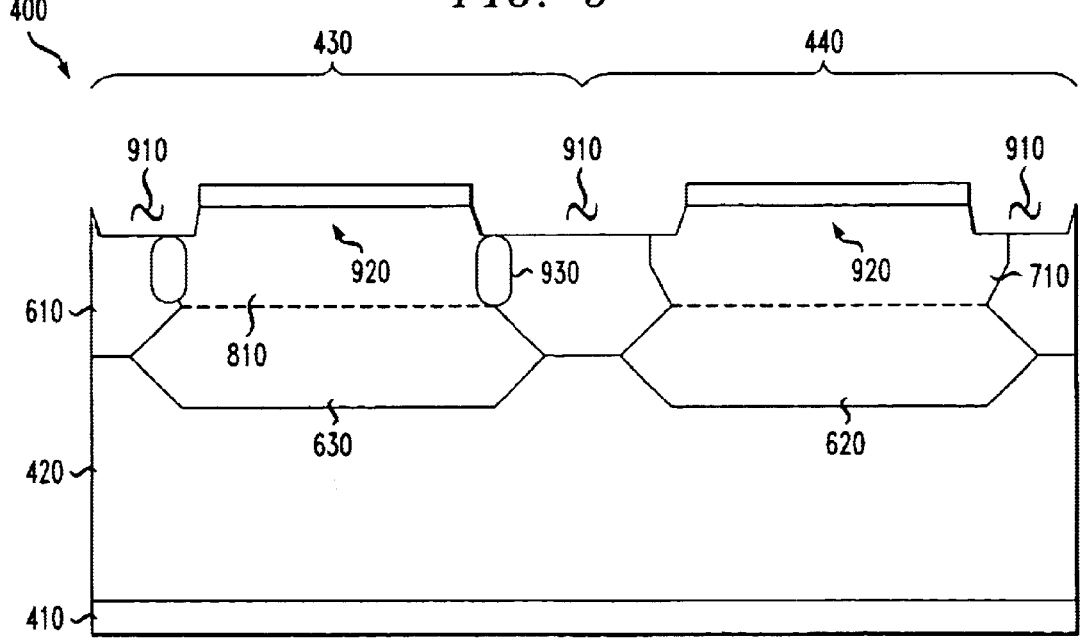
FIG. 9 illustrates a cross-sectional view of the partially completed semiconductor device illustrated in FIG. 8, after formation of optional recessed portions and a channel stop implant.

Turning to FIG. 9, shown is a cross-sectional view of the partially completed semiconductor device 400 illustrated in FIG. 8, after formation of optional recessed portions 910. The recessed portions 910, which may ultimately be used to form isolation structures in a subsequent step, may be formed by growing a first thin oxide layer, then depositing a nitride layer, then depositing a second thin oxide layer, and subsequently etching the dielectric stack 920 to form a mask. The dielectric stack 920 might then be patterned to remain in areas where the recessed portions 910 are not desired. After the mask has been provided, exposed portions of the epitaxial layer 610 may be etched. One skilled in the art understands how to etch the exposed portions of the epitaxial layer 610, including using a Reactive Ion Etch (RIE) to remove the exposed portions. In an exemplary embodiment, the recessed portions 910 will have a depth that ranges from about 150 nm to about 250 nm, and more specifically, a depth of about 200 nm.

After forming the recessed portions 910, in an optional step, the partially completed semiconductor device illustrated in FIG. 9 may be subjected to a channel stop implant 930. In the illustrative embodiment shown in FIG. 9, the channel stop implant 930 might be performed within the NMOS device region 430, using conventional photoresist layers to define the region prior to implanting a P-type dopant to a concentration of about 5E13 atoms/cm$^3$. In an exemplary embodiment, the channel stop implant 930 is conducted at an energy of about 90 keV, and is designed to further reduce the effect of bipolar parasitic transistors within the NMOS device region 430 and PMOS device region 440. While it has been illustrated that the channel stop implants 930 contact the first and second buried layers 620, 630, one skilled in the art understands that this is not always the case.

Figure 10:
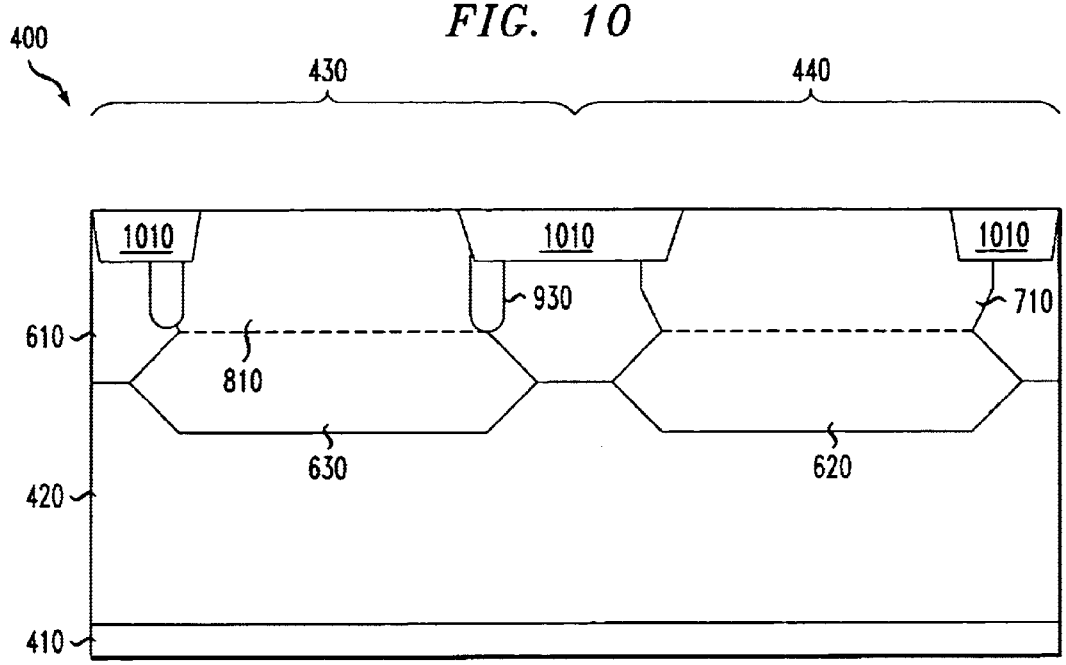
FIG. 10 illustrates a cross-sectional view of the partially completed semiconductor device illustrated in FIG. 9, after formation of isolation structures within the recessed portions.

Turning now to FIG. 10, shown is a cross-sectional view of the partially completed semiconductor device 400 illustrated in FIG. 9, after formation of isolation structures 1010 within the recessed portions 910. The isolation structures 1010 help isolate the NMOS device region 430 and PMOS device region 440 from one another, as well as isolate the NMOS device region 430 and PMOS device region 440 from devices located adjacent thereto.

In the embodiment shown in FIG. 10, the isolation structures 1010 are Local Oxidation Of Silicon (LOCOS) isolation structures. The LOCOS isolation structures may be formed by subjecting the partially completed semiconductor device 400 illustrated in FIG. 9, to a wet oxidation. The wet oxidation, which may be conducted at a temperature of about 1000° C., should continue until the LOCOS isolation structure obtains a thickness ranging from about 500 nm to about 600 nm, and more preferably a thickness of about 550 nm.

Figure 11:
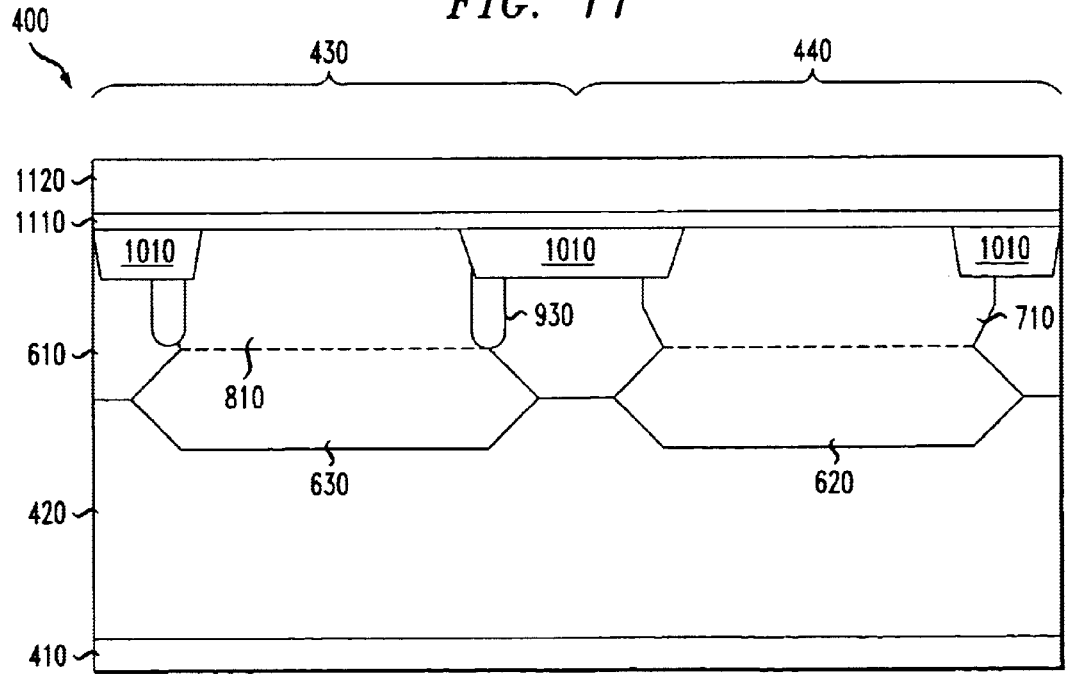
FIG. 11 illustrates a cross-sectional view of the partially completed semiconductor device illustrated in FIG. 10, after formation of a gate oxide layer and a gate electrode layer.

While an example has been given above wherein the isolation structures 1010 are LOCOS isolation structures, one skilled in the art understands that other isolation structures 1010 are within the scope of the present invention. For example, in an alternative embodiment, a trench isolation structure could be used in place of or in conjunction with, the LOCOS isolation structures. If used, the trench isolation structures could substantially isolate the NMOS device region 430 and PMOS device region 440 from one another. After completion of the isolation structures 1010, the dielectric stack 920 may be conventionally removed, Turning to FIG. 11, shown is a cross-sectional view of the partially completed semiconductor device 400 illustrated in FIG. 10, after formation of a gate oxide layer 1110 and a gate electrode layer 1120. In an exemplary embodiment, prior to forming the gate oxide layer 1110, a conventional NMOS device region 430 threshold voltage adjust implant and a conventional PMOS device region 440 threshold voltage adjust implant could be performed.

The gate oxide layer 1110 may be formed to a thickness of about 12.5 nm. One skilled in the art understands how to form the gate oxide layer 1110, including oxidizing the surface of the partially completed semiconductor device 400 in the presence of both oxygen and hydrochloric acid. While a specific example has been given how to form the gate oxide layer 1110, it should be noted that methods for forming gate oxide layers are well known in the art, and may vary accordingly.

The gate electrode layer 1120 generally comprises polysilicon and may be formed to a thickness of about 3000 nm. In an exemplary embodiment, the gate electrode layer 1120 is deposited using a conventional chemical vapor deposition (CVD) process, physical vapor deposition (PVD) process, or another similar process. Additionally, the gate electrode layer 1120 is generally conventionally doped (e.g., N-type), for example in-situ.

Turning now to FIG. 12, shown is a cross-sectional view of the partially completed semiconductor device 400 illustrated in FIG. 11, after defining an NMOS gate 1210 and a PMOS gate 1220. One skilled in the art understands how to define the NMOS gate 1210 and PMOS gate 1220.

Turning to FIG. 13, illustrated is a cross-sectional view of the partially completed semiconductor device 400 shown in FIG. 12, after formation of lightly doped NMOS source/drain regions 1310 and lightly doped PMOS source/drain regions 1320. One skilled in the art understands how to form the lightly doped NMOS source/drain regions 1310 and lightly doped PMOS source/drain regions 1320, including individually masking and doping the regions. In an exemplary embodiment, the lightly doped NMOS source/drain regions 1310 may be doped with phosphorous using a dose of about 2E13 atoms/cm$^2$, and at an energy of about 60 keV. Alternatively, the lightly doped PMOS source/drain regions 1320 may be doped with boron using a dose of about 2E13 atoms/cm$^2$, and at an energy of about 5.0 keV.

Figure 14:
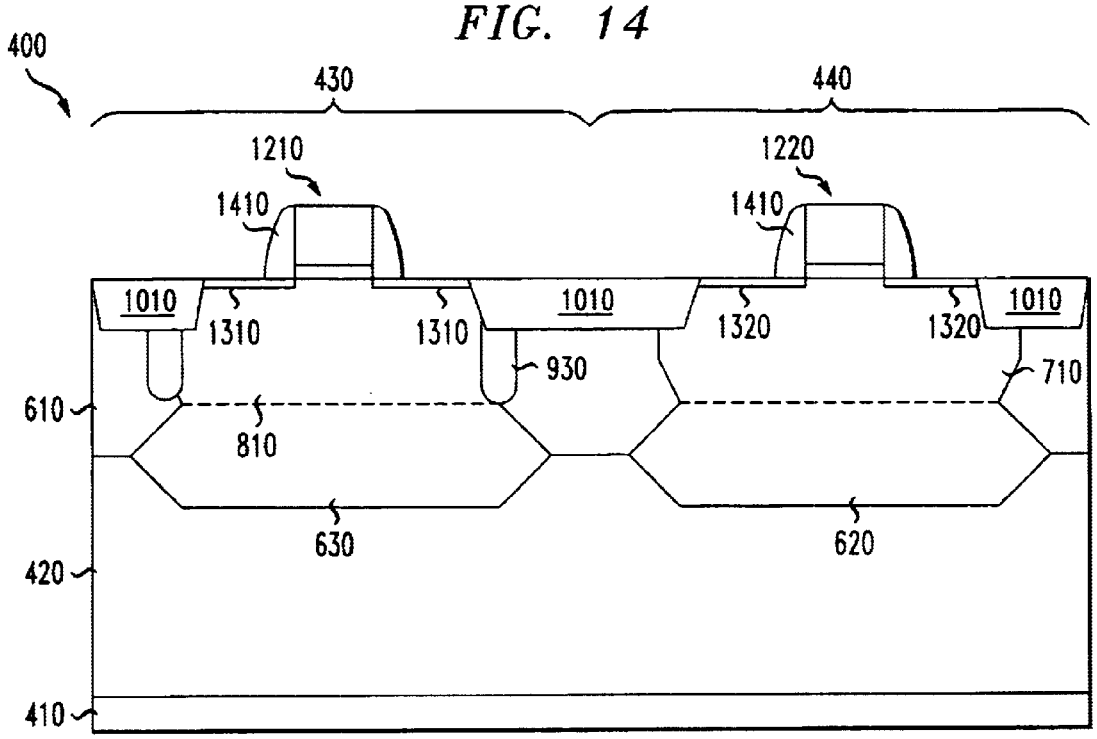
FIG. 14 illustrates a cross-sectional view of the partially completed semiconductor device illustrated in FIG. 13, after formation of gate sidewall spacers.

Turning briefly to FIG. 14, shown is a cross-sectional view of the partially completed semiconductor device 400 illustrated in FIG. 13, after formation of gate sidewall spacers 1410. The use and formation of gate sidewall spacers 1410 is well known in the art, thus, no discussion is required.

Figure 15:
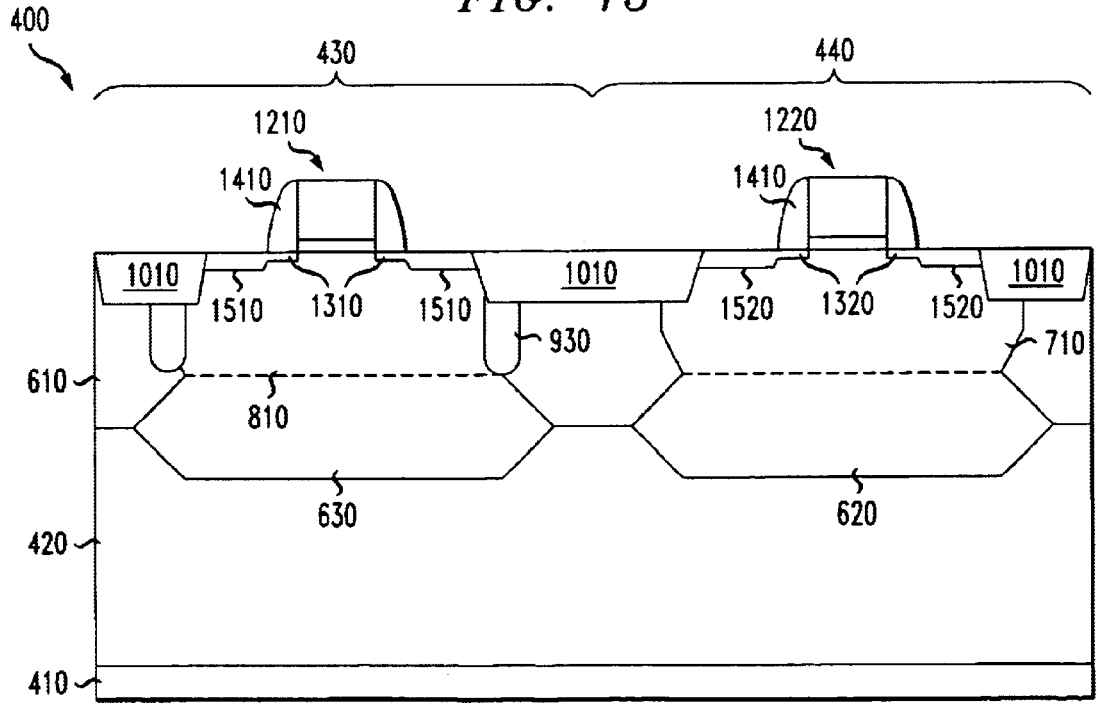
FIG. 15 illustrates a cross-sectional view of the partially completed semiconductor device illustrated in FIG. 14, after formation of heavily doped NMOS source/drain regions and heavily doped PMOS source/drain regions.

Turning to FIG. 15, shown is a cross-sectional view of the partially completed semiconductor device 400 illustrated in FIG. 14, after formation of heavily doped NMOS source/drain regions 1510 and heavily doped PMOS source/drain regions 1520. One skilled in the art understands how to form the heavily doped NMOS source/drain regions 1510 and heavily doped PMOS source/drain regions 1520, including individually masking and doping the regions. In an exemplary embodiment, the heavily doped NMOS source/drain regions 1510 may be doped with arsenic or phosphorous using a dose of about 1E15 atoms/cm$^2$. Alternatively, the heavily doped PMOS source/drain regions 1520 may be doped with boron using a dose of about 3E15 atoms/cm$^2$. After completion of the heavily doped NMOS and PMOS source/drain regions 1510, 1520, respectively, a device similar to the completed semiconductor device 300 illustrated in FIG. 3, might result.

Figure 16:
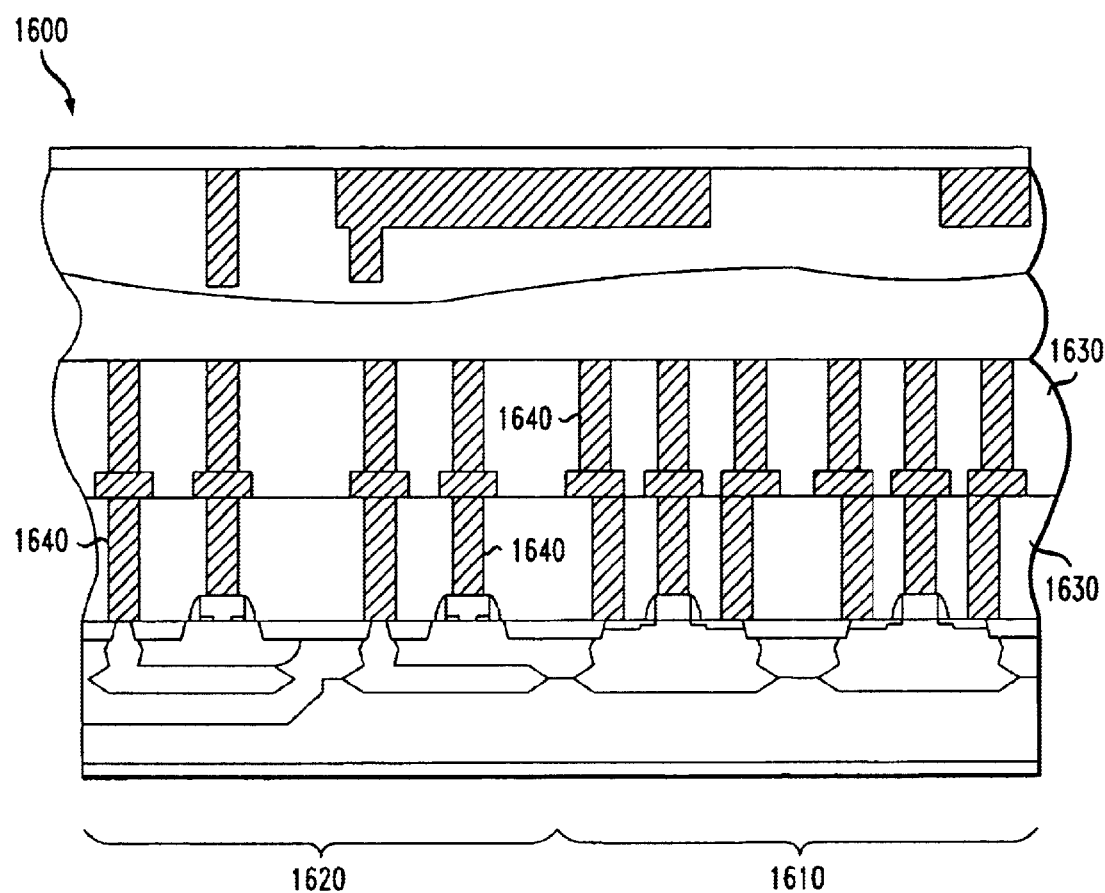
FIG. 16 illustrates a sectional view of a conventional integrated circuit (IC), incorporating semiconductor devices constructed according to the principles of the present invention.

Turning to FIG. 16, illustrated is a cross-sectional view of a conventional integrated circuit (IC) 1600, incorporating semiconductor devices 1610 constructed according to the principles of the present invention. The IC 1600 may further include Bipolar devices, or other types of devices. The IC 1600 may additionally include passive devices, such as inductors or resistors, or it may also include optical devices or optoelectronic devices. Those skilled in the art are familiar with these various types of devices and their manufacture.

In the particular embodiment illustrated in FIG. 16, the IC 1600 includes the semiconductor devices 1610 and bipolar devices 1620, having dielectric layers 1630 located thereover. The IC 1600 additionally includes, interconnect structures 1640 located within the dielectric layer 1630, that interconnect the semiconductor devices 1610 and bipolar devices 1620, thus, forming the operational integrated circuit 1600. Incorporating the semiconductor devices 1610 within the process flow of forming the bipolar devices 1620 is particularly beneficial. A large number of steps, time and money may be saved by doing so.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    forming a well doped with a P-type dopant over a semiconductor substrate;
    creating a buried layer having a thickness ranging from about 1000 nm to about 3000 nm between the well and the semiconductor substrate, wherein the buried layer has a P-type dopant located therein; and
    forming a gate over the well.

2. The method as recited in claim 1 wherein creating a buried layer including a P-type dopant includes creating a first buried layer including a first dopant, and wherein forming a gate and a well includes forming a first gate and a first well, and the method further includes forming a second well doped with a second dopant over the semiconductor substrate, creating a second buried layer including the second dopant between the second well and the semiconductor substrate, and forming a second gate over the second well.

3. The method as recited in claim 1 wherein creating a buried layer having a thickness ranging from about 1000 nm to about 3000 nm includes creating a buried layer having a thickness of about 2000 nm.

4. The method as recited in claim 1 wherein creating a buried layer includes creating a buried layer having a P-type dopant concentration ranging from about 1E18 atoms/cm$^3$ to about 5E19 atoms/cm$^3$.

5. The method as recited in claim 1 wherein forming a well includes forming an epitaxial layer having a thickness of less than about 5000 nm over the buried layer, then forming the well within the epitaxial layer.

6. The method as recited in claim 5 wherein forming an epitaxial layer having a thickness of less than about 5000 nm includes forming an epitaxial layer having a thickness ranging from about 1000 nm to about 2000 nm.

7. A method of manufacturing a semiconductor device, comprising:
    forming a well doped with a P-type dopant over a semiconductor substrate;
    creating a buried layer between the well and the semiconductor substrate, wherein the buried layer has a P-type dopant concentration ranging from about 1E18 atoms/cm$^3$ to about 5E19 atoms/cm$^3$ located therein; and
    forming a gate over the well.

8. The method as recited in claim 7 wherein creating a buried layer including a P-type dopant includes creating a first buried layer including a first dopant, and wherein forming a gate and a well includes forming a first gate and a first well, and the method further includes forming a second well doped with a second dopant over the semiconductor substrate, creating a second buried layer including the second dopant between the second well and the semiconductor substrate, and forming a second gate over the second well.

9. The method as recited in claim 7 wherein creating a buried layer includes creating a buried layer having a thickness ranging from about 1000 nm to about 3000 nm.

10. The method as recited in claim 7 wherein creating a buried layer having a thickness ranging from about 1000 nm to about 3000 nm includes creating a buried layer having a thickness of about 2000 nm.

11. The method as recited in claim 7 wherein forming a well includes forming an epitaxial layer having a thickness of less than about 5000 nm over the buried layer, then forming the well within the epitaxial layer.

12. The method as recited in claim 11 wherein forming an epitaxial layer having a thickness of less than about 5000 nm includes forming an epitaxial layer having a thickness ranging from about 1000 nm to about 2000 nm.

13. A method of manufacturing a semiconductor device, comprising:
    forming an epitaxial layer having a thickness ranging from about 1000 nm to about 2000 nm over a semiconductor substrate;
    forming a well doped with a P-type dopant in the epitaxial layer;
    creating a buried layer between the well and the semiconductor substrate, wherein the buried layer has a P-type dopant located therein; and
    forming a gate over the well.

14. The method as recited in claim 13 wherein creating a buried layer including a P-type dopant includes creating a first buried layer including a first dopant, and wherein forming a gate and a well includes forming a first gate and a first well, and the method further includes forming a second well doped with a second dopant over the semiconductor substrate, creating a second buried layer including the second dopant between the second well and the semiconductor substrate, and forming a second gate over the second well.

15. The method as recited in claim 13 wherein creating a buried layer includes creating a buried layer having a thickness ranging from about 1000 nm to about 3000 nm.

16. The method as recited in claim 15 wherein creating a buried layer having a thickness ranging from about 1000 nm to about 3000 nm includes creating a buried layer having a thickness of about 2000 nm.

17. The method as recited in claim 13 wherein creating a buried layer includes creating a buried layer having a P-type dopant concentration ranging from about 1E18 atoms/cm$^3$ to about 5E19 atoms/cm$^3$.

* * * * *